Figure 1:
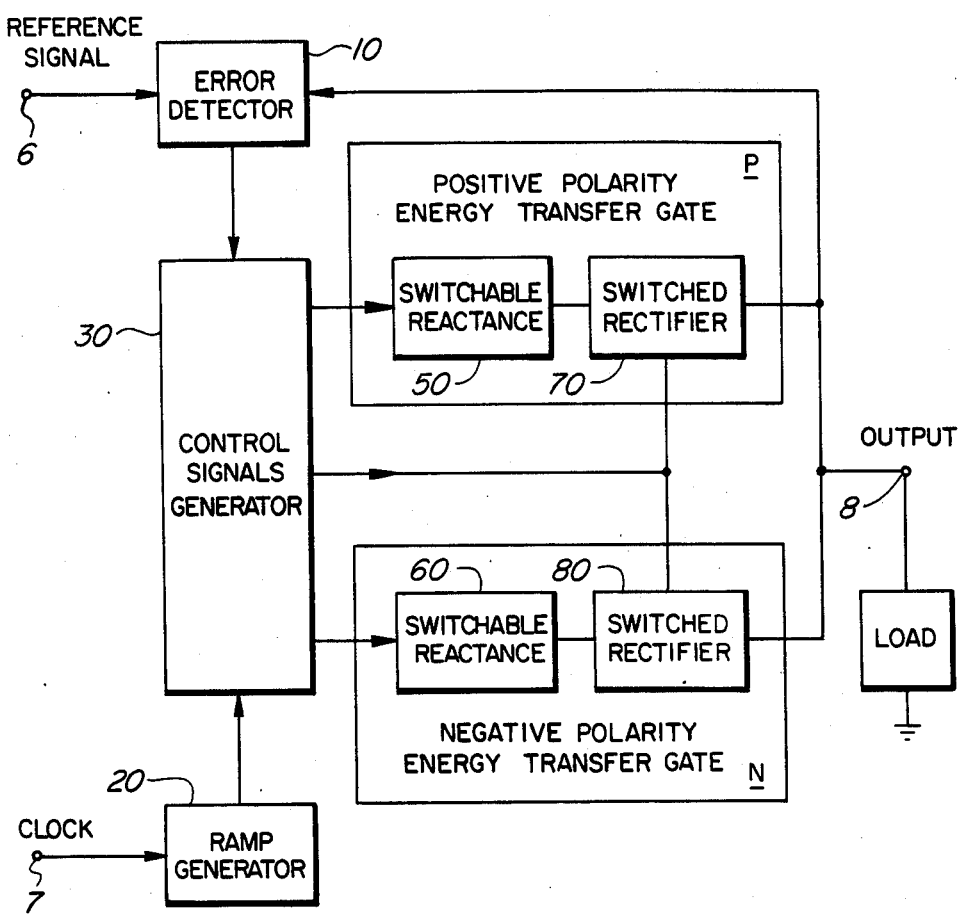

United States Patent [19]

Pollard

[11] Patent Number: 4,703,500
[45] Date of Patent: Oct. 27, 1987

[54] POWER AMPLIFIER

[75] Inventor: Brian J. Pollard, Watford, England

[73] Assignee: Northern Telecom Limited, Montreal, Quebec, Canada

[21] Appl. No.: 824,278

[22] Filed: Jan. 30, 1986

[30] Foreign Application Priority Data

Oct. 28, 1985 [CA] Canada ................................ 493990

[51] Int. Cl.$^4$ ............................................ H04M 3/02
[52] U.S. Cl. .................................... 379/252; 379/253; 379/418
[58] Field of Search ............... 379/252, 251, 253, 254, 379/307, 395, 341, 342, 418, 382

[56] References Cited

U.S. PATENT DOCUMENTS

| 4,284,854 | 8/1981 | Hayward et al. | 379/253 |
| 4,349,703 | 9/1982 | Chea, Jr. | 379/418 X |
| 4,500,844 | 2/1985 | Lisco | 379/418 |

Primary Examiner—James L. Dwyer

Attorney, Agent, or Firm—Schwartz, Jeffery, Schwaab, Mack, Blumenthal & Evans

[57] ABSTRACT

A power amplifier includes negative and positive terminals for connection across a direct current supply, an input for receiving a reference signal and an output for supplying an amplified replica of the reference signal. Positive polarity and negative polarity energy transfer gates are controlled to store electrical energy from the direct current supply, and to subsequently release electrical energy to the output. A control circuit is responsive to the reference signal and a potential amplitude at the output, for controlling which of either or neither of the positive polarity and negative polarity energy gates is active, and for controlling each quantity of electrical energy stored by an active one of the energy gates so that the amplified replica of the reference signal is provided. In an example, the power amplifier is used to efficiently generate ringing battery signals for use in a telephone facility.

10 Claims, 2 Drawing Figures

POWER AMPLIFIER

The invention is in the field of power amplifiers. More particularly, the invention relates to an apparatus and method for generating power signals having either a.c. or d.c. signal components or both, one example of such power signals being telephone rin9ing signals.

One of the requirements of a telephone system, be it small or large, is that of providing ringing signals for actuation of bell ringers or the like in called telephone station sets. Various types of ringing signals are provided for this purpose, however these signals are generally characterized by an a.c. signal component in a frequency range between 15 Hz and 100 Hz and of an amplitude in excess of 60 volts RMS being superimposed upon a d.c. voltage of around 50 volts. A recent example of a ringing signal generator is disclosed by Richard Hayward, John Bottrill and Robert C. Dittburner in U.S. Pat. No. 4,284,854, entitled "Universal Signal Generator For Generating Telephone System High Level Signals" and which issued on 18 Aug., 1981. One of the features in this example is that the ringing signal generator is operable from a talking battery supply in the switching facility by means of a floating power supply which supplies a higher voltage required for the generation of the various ringing signals. The flexibility of operation provided in this example permits economies of sharing each "Universal Signal Generator" among a large plurality of telephone lines in large and medium sized central office or private branch exchanges. However the cost of providing ringing signals in small telephone systems has remained proportionately greater per telephone line than it is in larger telephone systems.

It is an object of the invention to provide method and apparatus for amplifying signals which include either of a.c. and d.c. components or both.

It is also an object of the invention that the amplifying apparatus be operable directly from a talking battery supply in a typical or small telephone switching facility and be responsive to a low level reference signal for generating a corresponding ringing signal.

In accordance with the invention, a power amplifier is energizable by a direct current supply for amplifying an input signal to provide an output signal. The power amplifier includes positive polarity and negative polarity energy transfer gates, each being responsive to control signals for storing electrical energy from the direct current supply and for subsequently releasing electrical energy to an output terminal. A control circuit is responsive to the input signal and a potential amplitude appearing at the output terminal for generating the control signals to define which of either or neither of the positive polarity and negative polarity energy transfer gates is active, and to regulate each quantity of electrical energy stored by the active one of the energy transfer gates.

A method for amplifying an input signal to provide an output signal in accordance with the invention includes the steps of: continuously generating a control signal in proportion to a difference between predetermined and actual ratios of an amplitude of an input signal and a signal amplitude at an output terminal, and being of a polarity in accordance with said difference being negative or positive; transferring electrical energy between a direct current power supply and the output terminal, by storing one of positive polarity and negative polarity electrical energies in accordance with the polarity of the control signal and in an amount defined by the amplitude of the control signal, and subsequently releasing electrical energy to the output terminal.

Figure 2:
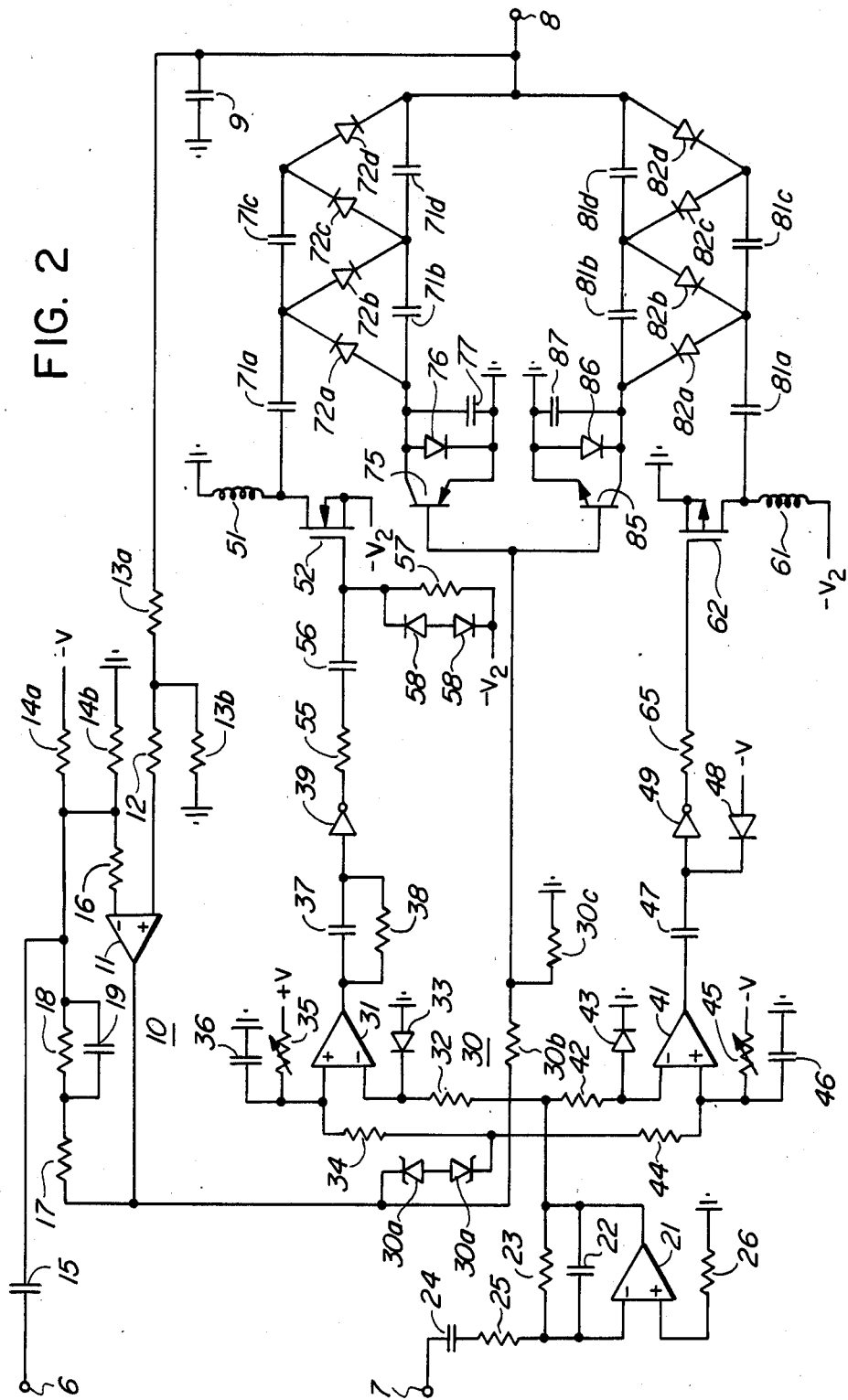

An example embodiment is described with reference to the accompanying drawings in which:

FIG. 1 is a simple block diagram of an amplifier in accordance with the invention, and FIG. 2 is a detailed schematic drawing of one example of the amplifier in FIG. 1. The amplifier in FIG. 1 is responsive to a reference signal applied at an input terminal 6 and a clock signal applied at an input terminal 7 for generating an amplified replica of the reference signal at an output terminal 8, for driving a load connected thereto.

The amplifier includes an error detector 10 which generates an error signal indicative of a difference between a ratio of the reference and the amplified signals and a predetermined required ratio. A ramp generator 20 responds to the clock signal by ganerating a corresponding triangular or sawtooth-like ramp signal. A control signal generator 30 is connected to receive the error signal and the ramp signal. The control signal generator 30 uses these signals to generate control signals for operating positive polarity and negative polarity energy transfer (P and N) gates to provide the amplified signal at the output terminal 8. The positive polarity energy transfer gate includes a switchable reactance circuit 50 and a switched rectifier 70. The negative polarity energy transfer gate includes a switchable reactance circuit 60 and a switched rectifier 80. Each of the switchable reactance circuits 50 and 60 operates in response to a pulse signal, directed thereto by the control signals generator 30, by temporarily storing electrical energy from an energizing current source (not shown), and subsequently releasing electrical energy via the associated switched rectifier. The control signals generator 30, in addition to providing the pulse signals for controlling the switchable reactances 50 and 60, also provides a control signal for causing either one or neither of the switched rectifiers 70 and 80 to be active. In an instant at which the detected error is substantially nil, that is when the signal at the output terminal 8 is as required, neither of the switched rectifiers is active. In an instant at which the detected error is positive the switched rectifier 80 is controlled to be ON, and in an instant at which the detected error is negative the switched rectifier 70 is controlled to be ON. By this arrangement, electrical energy is gated, in bursts between the energizing current source and output terminal 8, in accordance with that required to efficiently maintain the amplified replica of the reference signal at the output cerminal 8 over a wide range of loads of both resistive and reactive characteristics.

FIG. 2 is a detailed example of an amplifier of the form of that shown in FIG. 1. The error detector 10 includes a differential amplifier 11 having a non-inverting input connected via a resistor 12 to a junction of resistors 13a and 13b for receiving a fraction of the amplified signal from the output terminal 8. Resistors 16, 17 and 18 and a capacitor 19 connected as shown provide a feedback network for regulating the gain of the amplfier 11. Input reference signals from the input terminal 6 are coupled by a capacitor 15 and the resistor 16 to an inverting input of the differential amplifier 11 along with a negative bias potential developed across resistors 14a and 14b. In this particular example, the amplifier is adapted to the function of a ringing generator for a small telephone facility by the provision of the bias from the resistors 14a and 14b whereby a typical d.c. component of a ringing battery is simulated at the output terminal 8. A capacitor 9 is connected between ground and the output terminal 8 for removing high frequency noise which may otherwise be present in the amplified signal. The error signal is provided at the output of the differential amplifier 11.

The ramp generator 20 includes a differential amplifier 21, connected in combination with resistors 23, 25, and 26 and capacitors 22 and 24, to provide an integrator circuit, responsive in this example to symmetrical clock signals at the terminal 7, for generating triangular ramp signals.

Differential amplifiers 31 and 41 in the control signal generator 30 are configured to operate as pulse width modulators. Each amplfifier includes an inverting input, connected to diodes 33 and 43 respectively and coupled to the output of the differential amplifier 21 via resistors 32 and 42 respectively, for receiving the ramp signal. Each amplifier also includes a non-inverting input connected via resistors 34 and 35 and resistors 44 and 45 respectively as shown, for receiving a center-clipped error signal. The center-clipped error signal is derived across back-to-back Zener diodes 30a which are connected between the output of the error detector 10 and a junction of the resistors 34 and 44. The junction is maintained at near a.c. and d.c. ground potential, while there is insufficient error signal to cause conduction in the Zener diodes 30a, by capacitors 36 and 46 and the resistors 35 and 45 respectively. An inverting amplifier 39 includes an input which is coupled to the output of the differential amplifier 31 by a parallel combination of a capacitor 37 and a resistor 38, such that the output of the inverting amplifier 39 provides the control pulses for the operation of the positive polarity energy gate 50. An inverting amplifier 49 includes an input which is coupled to the output of the differential amplifier 41 by a capacitor 47 and which is clamped by a diode 48 such that an output of the inverting amplifier 49 provides the control pulses for operation of the negative polarity energy gate 60.

The positive polarity energy gate 50 includes a switchable inductive reactance which is providad by inductor 51 connected in series between ground and a source of energizing current −V2 by a switch 52, in this example, an n-channel field-effect transistor (FET). A gate electrode of the FET 52 is coupled, to receive the control pulses from the output of the inverting amplifier 39, by way of a level shifting network, which includes resistors 55 and 57, a capacitor 56 and back-to-back Zener diodes 58, connected as shown. A junction 53 of the inductor 51 and the FET 52, hereinafter referred to as a positive junction, is coupled by the switched rectifier 70 to the output terminal 8. A rectifying structure, in this example a voltage doubler, includes capacitors 71a–71d and diodes 72a–72d connected as shown. A junction between the capacitor 71b and an anode of the diode 72a is selectively groundable by a switch which is provided by a PNP transistor 75, and a protection network including a diode 76 and a capacitor 77.

The negative polarity energy gate 60 includes an inductive reactance provided by an inductor 61, similar to the inductor 51, which is switchably connected in series between −V2 and ground by a switch 62, in this example a p-channel FET. A gate electrode of the FET 62 is coupled to receive the control pulses from the output of the inverting amplifier 49 by way of a resistor 65. A junction 63 of the FET 62 and the inductor 61, hereinafter referred to as a negative junction 63, is coupled by the switched rectifier 80 to the output terminal 8. A rectifying structure, being a voltage doubler of complementary structure with respect to the first-mentioned voltage doubler, includes capacitors 81a–81d and diodes 82a–82d connected as shown. A junction between the capacitor 81b and a cathode of the diode 82a is selectively groundable by a switch, which is provided by an NPN transistor 85 and a protection network including a diode 86 and a capacitor 87. The transistors 75 and 85 are switched in a complementary manner in response to negative and positive potentials of a rectifier control signal. The rectifier control signal is provided by the error signal being coupled to base electrodes of the transistors 75 and 85 via a network provided by resistors 30b and 30c which are connected as shown.

In operation of the power amplfier illustrated in FIG. 2, the +V and −V potentials are supplied at about plus and minus 12 volts. The −V2 potential is supplied at about minus 50 volts, that is the potential of the typical telephone facility talking battery supply. The clock signal is obtained from any convenient stable frequency source, or it can be generated locally. The frequency of the clock signal is chosen to be low enough to be consistent with large-scale signal-switching limitations of the active circuit components, while at the same time being high enough to minimize the component values of the inductors 51 and 61 and the capacitors 71a–71d, 81a–81d. In this example a stable square-wave clock signal of 900 to 1000 KHz has been found to be satifactory for component values of 20 microhenries and 0.1 microfarads respectively. The amplifier 21 generates the triangular signal, positive portions of which are directed to the inverting input of the differential amplfiers 31 by the diode 33, and negative portions of which are directed to the inverting input of the differential amplifier 41 by the diode 43. In a case where the error signal becomes sufficiently negative to be coupled across the Zener diodes 30a, the non-inverting input of the amplifier 31 is biased more negative to an extent such as to cause the output to go low for periods of time corresponding to those positive peaks of the triangular signal which exceed the bias. This in turn causes the output of the inverting amplfier 39 to become high for a corresponding time during which the FET 52 is caused to be conductive. Thus, pulses of current flow via the inductor 51, and energy transfers via the voltage doubler 70, are established. When a peak of the triangular signal no longer exceed the bias, the FET 52 is turned OFF. Throughout this time, the rectifier control signal also maintains the transistor 75 in an ON state, to enable the voltage doubler to couple energy from the inductor 51 to the output terminal 8. The function of the amplifiers 41 and 49, the switchable reactance 60, and the switched rectifier at 80, is essentially the same for positive error signals as that just described.

As before mentioned in this example, the Zener diodes 30a center-clip the error signal. This arrangement provides for sequential control firstly of the switched rectifiers and secondly of the switchable reactances. By this means, leading and lagging current components, as for example accompany complex load impedances at the output terminal 8, are not allowed to distort the waveform of the amplified replica of the reference signal. These leading and lagging current components are dissipated as heat in either of the transistors 75 and 85 to maintain the required instantaneous potential at the output terminal 8. However, if the load is restricted to being purely resistive in nature, the sequential control and hence the center-clipping function provided by the diodes 30a are not required.

What is claimed is:

1. A power amplifier being energizable by a direct current supply for amplifying an input signal to provide an output signal, the power amplifier comprising:
   positive and negative terminals for connection across the direct current supply;
   positive polarity and negative polarity energy transfer gates being responsive to control signals, for storing electrical energy from the direct current supply and for subsequently releasing electrical energy to an output terminal, said energy transfer gates each comprising a switchable reactance circuit being responsive to a respective one of the control signals, and a switched rectifier for coupling electrical energy between the switchable reactance and the output terminal in response to another of the control signal;
   a control circuit being responsive to the input signal and a potential amplitude appearing at the output terminal for generating said control signals to define which of either or neither of the positive polarity and negative polarity energy transfer gates is active and to regulate each quantity of electrical energy stored by an active one of the energy transfer gates;
   whereby the output signal appears at the output terminal with an amplitude controlled in accordance with the input signal.

2. A power amplifier as defined in claim 1 wherein the positive polarity energy transfer gate comprises:
   an inductor being connected in series between the positive terminal and a positive junction and a switch being connected in series between the negative terminal and the positive junction, the switch being responsive to a pulse of said control signal for conducting a pulse of current via the inductor, and
   a switched rectifier being connected between the positive junction and the output terminal and being poled to conduct current to the output terminal; and
   wherein the negative polarity energy transfer gate comprises:
   an inductor being connected in series between the negative terminal and a negative junction and a switch being connected in series between the positive terminal and the negative junction, the switch being responsive to a pulse of said control signal for conducting a pulse of current via the inductor, and
   a switched rectifier being connected between the negative junction and the output terminal and being poled to conduct current from the output terminal.

3. A power amplifier as defined in claim 1 wherein the control signals consist of first and second control width-modulated pulse signals and a rectifier control signal, the control circuit comprising:
   an error detector circuit for generating an error signal in response to a difference between a predetermined ratio of the input and output signals and an instantaneous ratio of the input and output signals;
   a ramp generator for generating a periodic triangular-like ramp signal; and
   a control signal generator including positive and negative control pulse generators, a center-clipper connected to an output of the error detector circuit for providing a center clipped signal and a resistor network connected to the output of the error detector circuit for providing the rectifier control signal, the positive control pulse generator being responsive to the ramp signal and a negative polarity of the center-clipped signal for proportionately generating the first width-modulated pulses for causing energy storage in the positive polarity energy transfer gate, the negative control pulse generator being responsive to the ramp signal and a positive polarity of the center-clipped signal for proportionately generating the second width-modulated pulse signals for causing energy storage in the negative polarity energy transfer gate.

4. A power amplifier as defined in claims 1 wherein each switched rectifier includes a voltage multiplier whereby potentials at the output terminal may be greater than the potential across the negative and positive terminals.

5. A power amplifier being energizable by a talking battery supply in a telephone switching facility and a periodic clock signal, for generating a telephone ringing signal having an a.c. component being an amplified replica of an alternating current reference input signal, comprising:
   positive and negative terminals for connection across the talking battery supply;
   an error detector circuit including an amplifier, a bias means for providing a d.c. potential at an input of the amplifier, an a.c. coupling means for superimposing the a.c. reference input signal on the d.c. potential, the amplifier being responsive to the a.c. and d.c. components at said input and to the output signal for generating an error signal being indicative of difference between said a.c. and d.c. components and attenuated a.c. and d.c. components of the output signal;
   a ramp generator being responsive to the clock signal for generating triangular ramp signals;
   a control circuit including, a resistance network for providing a rectifier control signal from the error signal, a first differential amplifier circuit being responsive to the triangular ramp signals and to an indication of negative error in the error signal for generating first control pulses being width-modulated in proportion to the negative error, a second differential amplifier circuit being responsive to the triangular ramp signals and to an indication of positive error in the error signal for generating second control pulses being width-modulated in proportion to the positive error;
   a positive polarity energy pump including an inductor connected between the positive terminal and a switch, the switch being connected to the negative terminal, and being responsive to the first control pulses for conducting current via the inductor;
   a switched voltage multiplier circuit being connected between the output terminal and a junction of the inductor and the switch, and including a rectifier structure being poled to conduct current toward the output terminal, and a switch being responsive to the rectifier control signal to be ON to enable function of the rectifier structure while said signal is of a polarity corresponding to said negative error;

a negative polarity energy pump including an inductor connected between the negative terminal and a switch, the switch being connected to the positive terminal and being responsive to the first control pulses for conducting current via the inductor;

a switched voltage multiplier circuit being connected between the output terminal and a junction of the inductor and the switch, and including a rectifier structure being poled to conduct current from the output terminal, and a switch being responsive to the rectifier control signal to be ON to enable function of the rectifier structure while said signal is of a polarity corresponding to said positive error.

6. A power amplifier as defined in claim 5 wherein the first and second differential amplifiers include positive and negative bias networks being coupled to receive the error signal through a center-clipping circuit such that the appropriate one of the voltage multipliers is in an ON condition both before and after operation of the corresponding energy pump.

7. A power amplifier as defined in claim 5 wherein the switch in each of the energy pumps is a field effect transistor having a gate electrode being coupled to the respective one of the first and second differential amplfiers by a respective level shifting circuit.

8. A method for amplifying an input signal at an input terminal to provide an output signal at an output terminal, the method comprising the steps of:
(a) continuously generating a control signal in proportion to a difference between predetermined and actual ratios of an amplitude of the input signal and a signal amplitude at the output terminal, and being of a polarity in accordance with said difference being negative or positive;
(b) transferring electrical energy between a direct current power supply and the output terminal by storing one of positive polarity and negative polarity electrical energies in accordance with the polarity of the control signal and in an amount defined by the amplitude of the control signal;
(c) subsequently releasing electrical energy to the output terminal; and
(d) rapidly repeating steps (b) and (c) on a continuous basis whereby the output signal is provided.

9. A method as defined in claim 8 wherein:
step (a) includes center-clipping the control signal and generating one of first and second pulse signals in accordance with a polarity of the center-clipped control signal being one of negative and positive, said pulses being width-modulated in proportion to the amplitude of the center-clipped signal;
step (b) includes conducting current in one of first and second directions through inductive means via a power supply for periods of time corresponding to the width-modulation of a corresponding one of the first and second pulse signals; and
step c includes conducting current between the inductive means and the output terminal for a period of time immediately following each pulse signal and in a direction consistent with the direction of current conduction in step (b).

10. A method as defined in claim 8 wherein step (b) is performed only in response to the control signal exceeding a predetermined amplitude limit, the method comprising the further step of providing a unidirectional current path being of a resistance varied inversely with the amplitude of the control signal and being poled in accordance with the polarity of the control signal, whereby energy from a reactive load element at the output terminal is dissipated across the resistance of the current path.

* * * * *